(12) United States Patent
Kumar

(10) Patent No.: US 7,102,355 B1
(45) Date of Patent: Sep. 5, 2006

(54) METHOD, APPARATUS AND COMPUTER-READABLE CODE FOR MAGNIFYING AN INCIPIENT GROUND FAULT AND ENABLE QUICK DETECTION OF SUCH FAULT

(75) Inventor: Ajith Kuttannair Kumar, Erie, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/385,310

(22) Filed: Mar. 21, 2006

(51) Int. Cl.
*G01R 31/14* (2006.01)
*H02H 9/08* (2006.01)

(52) U.S. Cl. ............... 324/509; 324/510; 324/511; 361/42

(58) Field of Classification Search ............... 324/509, 324/510, 511; 361/42
See application file for complete search history.

(56) References Cited

U.S. PATENT DOCUMENTS

| | | |
|---|---|---|
| 4,541,031 A | 9/1985 | Ibbetson |
| 4,827,369 A | 5/1989 | Saletta et al. |
| 5,160,926 A | 11/1992 | Schweitzer, III |
| 5,282,212 A | 1/1994 | Shah |
| 5,309,109 A | 5/1994 | Miyazaki et al. |
| 5,561,380 A | 10/1996 | Sway-Tin et al. |
| 5,710,777 A | 1/1998 | Gawne |
| 5,768,079 A | 6/1998 | Buell |
| 5,872,457 A | 2/1999 | Williams |
| 5,877,926 A | 3/1999 | Moisin |
| 5,945,802 A | 8/1999 | Konrad et al. |
| 5,946,172 A | 8/1999 | Hansson et al. |
| 5,982,593 A | 11/1999 | Kimblin et al. |
| 5,990,686 A | 11/1999 | Vokey et al. |
| 6,002,563 A | 12/1999 | Esakoff et al. |
| 6,049,143 A | 4/2000 | Simpson et al. |
| 6,081,122 A | 6/2000 | McCary |
| 6,246,556 B1 * | 6/2001 | Haun et al. .................. 361/42 |
| 6,318,160 B1 | 11/2001 | Bessler |
| 6,347,025 B1 | 2/2002 | Ulrich et al. |
| 6,421,618 B1 * | 7/2002 | Kliman et al. ................ 705/58 |
| 6,497,182 B1 | 12/2002 | Melpolder et al. |
| 6,747,458 B1 * | 6/2004 | Huber et al. ................ 324/527 |
| 6,804,094 B1 * | 10/2004 | Kampmeyer ................ 361/42 |
| 2003/0155928 A1 * | 8/2003 | Roden et al. ............... 324/509 |
| 2003/0184932 A1 | 10/2003 | McNally et al. |
| 2004/0162696 A1 | 8/2004 | Kumar |

\* cited by examiner

*Primary Examiner*—Anjan Deb
*Assistant Examiner*—Amy He
(74) *Attorney, Agent, or Firm*—Carlos Hanze; Enrique J. Mora; Beusse, Wolter, Sanks, Mora & Maire, P.A.

(57) ABSTRACT

Method, apparatus and computer-readable code are provided for detecting a location of an incipient ground fault in an electrical propulsion system of a relatively large land-based vehicle, such as a locomotive. A method embodying aspects of the present invention allows to simultaneously apply a forcing function to one or more electrical devices connected to a direct current (dc) bus. The forcing function is configured to magnify (without voltage stress to such devices) an incipient ground fault that may be directly associated with a given electrical device. This enables to quickly identify the incipient ground fault and to uniquely identify the electrical device likely to be experiencing the incipient ground fault.

14 Claims, 3 Drawing Sheets

METHOD, APPARATUS AND COMPUTER-READABLE CODE FOR MAGNIFYING AN INCIPIENT GROUND FAULT AND ENABLE QUICK DETECTION OF SUCH FAULT

FIELD OF THE INVENTION

The present invention is generally related to locomotive electrical systems, and more particularly, to a method, apparatus and computer-readable code for detecting an incipient ground fault that may occur in an electrical propulsion system of a traction vehicle.

BACKGROUND OF THE INVENTION

Locomotives and transit vehicles, as well as other large traction vehicles used for heavy haul applications (off-highway trucks), commonly use an electrical propulsion system that includes various high power electrical components, such as generators, rectifiers, converters, traction motors, dynamic braking grids, cooling blowers, and the like. These components may fail over time due to various reasons, one of them being electrical grounds that may be caused by insulation degradation. For example, locomotives may operate in environments subject to varying conditions, such as causative of freezing and thawing, which can degrade an electrical insulation exposed to such varying conditions by causing cracks.

The propulsion system of a locomotive has many insulated windings, and excessive leakage current could develop over time due to various factors, such as aging, moisture, abrasions, dirt built-up and the like. This is especially true for the traction motors since moisture often gets into these components because of their location and exposure to relatively harsh environmental conditions. Failures due to excessive electrical leakage currents in an electrical system of locomotives are a leading cause of system shutdowns and locomotive mission failures.

Leakage current detectors have been used on many kinds of electrical equipment to protect the equipment from damage that could arise in the presence of a large electrical current and/or to protect personnel from injury, and there may be substantial industrial background on leakage current monitoring by techniques used in electrical utility or industrial applications. Ground faults may occur as a result of a fault in any of a number of different system components. In the context of a locomotive, such components by way of example can include the propulsion drive system, batteries, and auxiliary equipment. Within the propulsion drive system, ground faults can occur in one or several components, which include generator, rectifier, cabling, traction motor, dynamic brake resistor, and blower motor.

A known difficulty in dealing with ground conditions in a locomotive is that many of such conditions may be transitory in nature. Often when a ground fault condition occurs, the affected portion of the electrical system is deactivated, and the locomotive is scheduled for repairs. However, once the locomotive is shopped for repairs, the system may no longer exhibit abnormal grounds and the maintenance personnel cannot identify the source of the fault. This is often because the excessive leakage current is caused by moisture in the electrical components. By the time the locomotive is shopped, the moisture has dried out, thus eliminating the high leakage currents. The amount of moisture that is able to penetrate the insulation system and result in high leakage currents often depends in part on the condition of the insulation system. A healthy system experiences relatively small change in leakage current as a result of changing moisture conditions, whereas a system with degraded insulation may experience large changes in leakage current that is moisture dependent.

In view of the foregoing considerations, it is desirable to have early warning of leakage current development, (i.e., an incipient ground fault) in the electrical propulsion of the locomotive so that action may be taken before there is a locomotive disabling failure. More particularly, it would be desirable that such an action enables continued operation of the locomotive propulsion system so that the locomotive can fulfill a mission and be able to return on its own power to a locomotive service shop for a thorough check and repair.

It would be further desirable to have the ability to determine in real time the specific equipment that causes the incipient ground fault, as that condition occurs, so that service personnel can retrieve at a later time that information and be able to focus on that specific equipment once the locomotive eventually arrives to the locomotive service shop, without trying to mimic the environmental conditions that may have contributed to the occurrence of the incipient ground fault or without having to spend valuable resources and time on troubleshooting fault-free equipment.

BRIEF DESCRIPTION OF THE DRAWINGS

These and other advantages of the invention will be more apparent from the following description in view of the drawings that show.

DETAILED DESCRIPTION OF THE INVENTION

Figure 1:
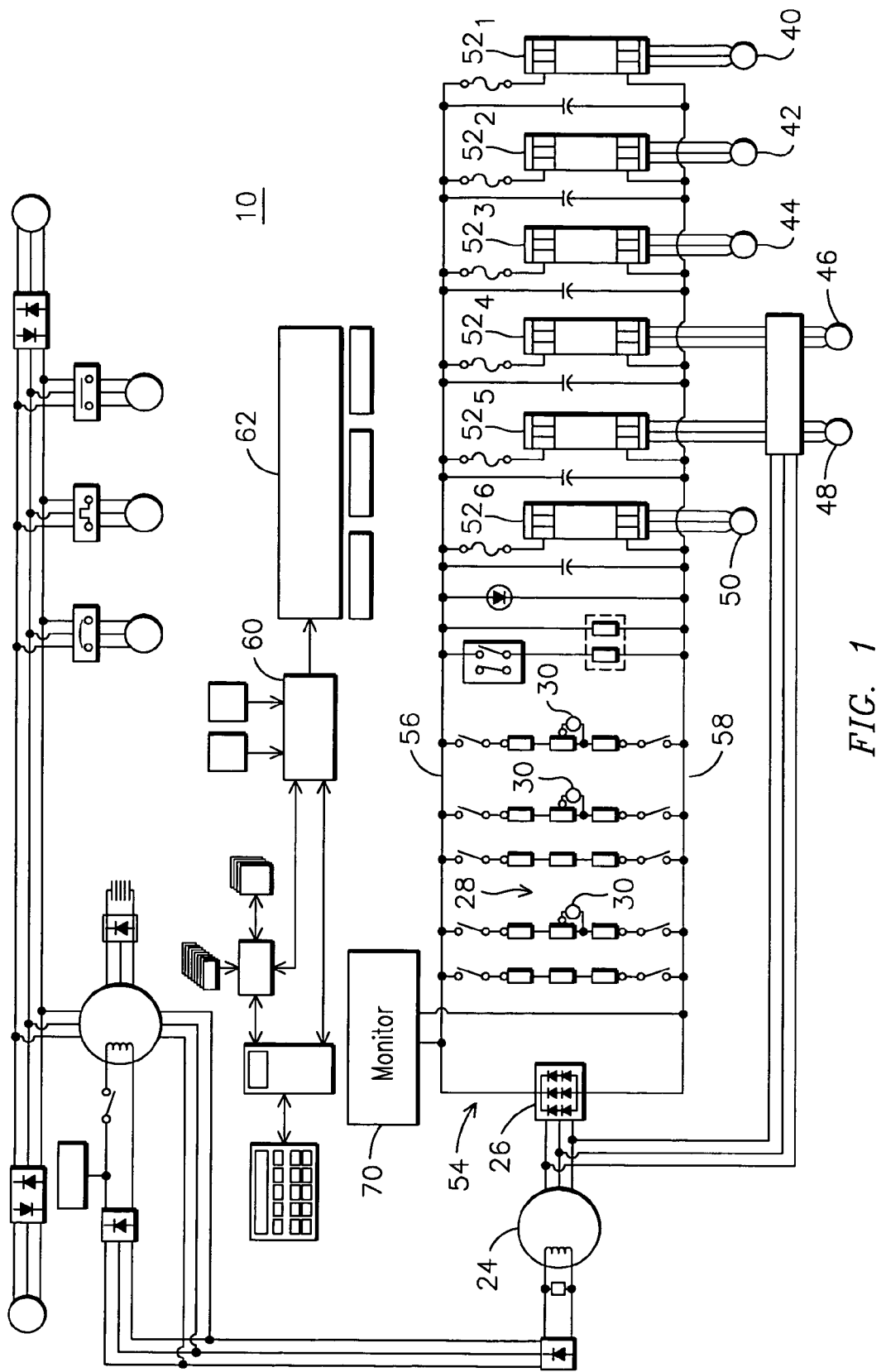
FIG. 1 is a schematic of one exemplary locomotive propulsion system that may benefit from aspects of the present invention.

FIG. 1 is a simplified schematic of one exemplary propulsion system 10, as may be used in a traction vehicle, such as a locomotive, a transit vehicle, or any other large traction vehicle as may be used for heavy haul applications (e.g., off-highway trucks). In one example embodiment, the propulsion system comprises a plurality of electrical devices that may be potentially subject to an incipient ground fault. Examples of such devices may be an alternator 24, a main rectifier 26, and a dynamic braking grid 28, which may include blowers 30. Further, illustrated in FIG. 1 are six traction motors 40, 42, 44, 46, 48, and 50, where each motor may be electrically connected to a respective inverter $52_1$–$52_6$ connected to a dc (direct current) bus 54 having a positive voltage rail 56 and a negative voltage rail 58. The propulsion system may further include a propulsion system controller 60, and a traction motor controller 62.

The inventor of the present invention has recognized an innovative method that will result in faster and consistently accurate detection of an incipient ground fault that may develop in an electrical device of the propulsion system. For example, in lieu of having to wait for the settling of relatively long transients to detect an incipient ground fault, as is generally done in prior ground fault detection techniques, a method embodying aspects of the present invention allows to simultaneously apply a forcing function to one or more electrical devices connected to a direct current (dc) bus. The forcing function is configured to magnify (without increasing the voltage stress to such devices) an incipient ground fault that may be directly associated with a given electrical device. This enables to quickly identify the incipient ground fault and to uniquely identify the electrical device likely to be experiencing the incipient ground fault. By way of example, a ground fault detector embodying aspects of the present invention will enable to detect essentially in a relatively short period of time (e.g., in the order of a few seconds) the location of the incipient ground fault (i.e., a leakage current which if not quickly interrupted could result in a vehicle-disabling failure) in one or more electrical devices connected to the direct current (dc) bus.

Figure 2:
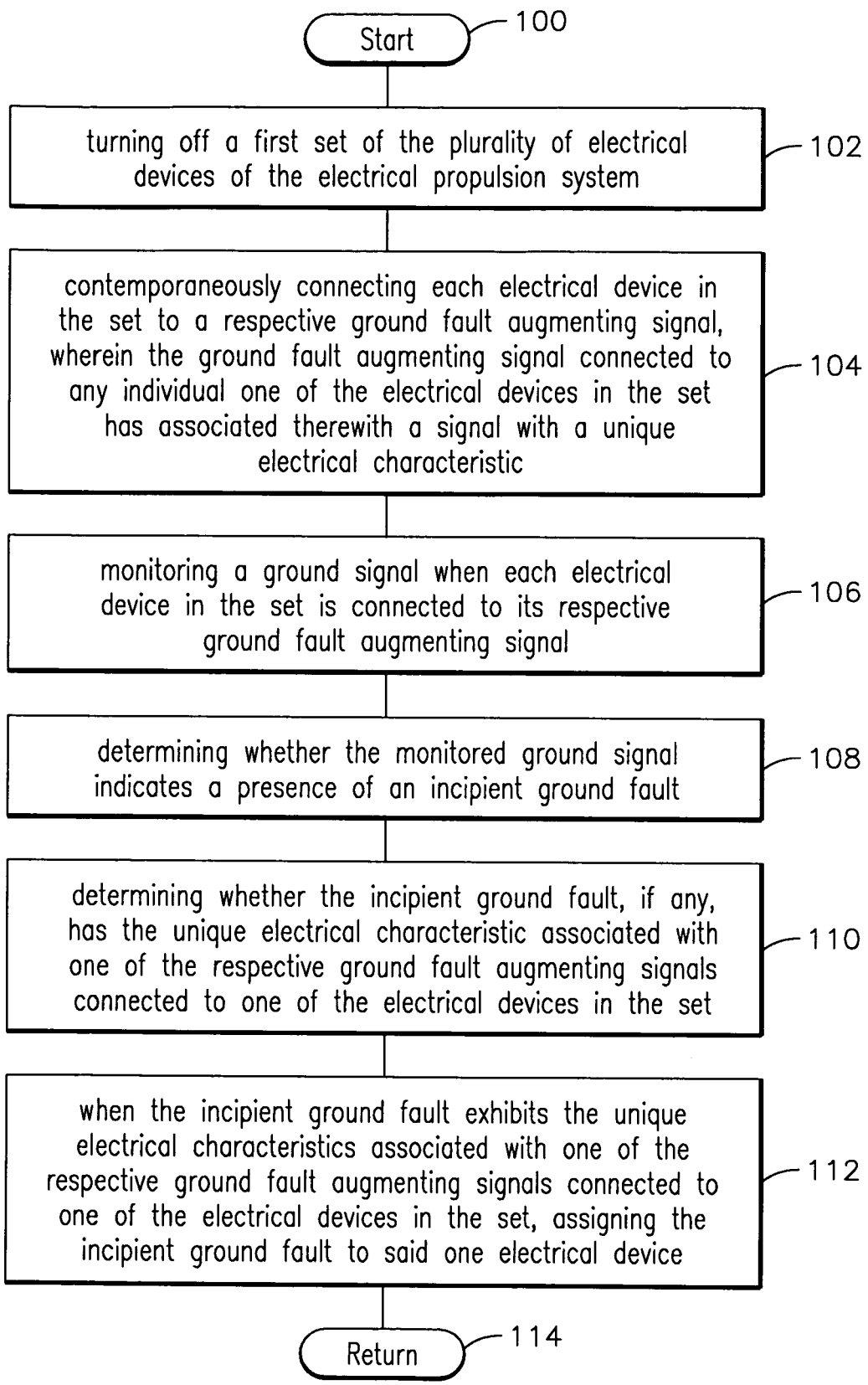
FIG. 2 is a flowchart with exemplary steps of a method for detecting an incipient ground fault that may occur in the electrical propulsion system of a traction vehicle.

FIG. 2 is a flowchart with exemplary steps of a method embodying aspects of the present invention for detecting an incipient ground fault that may occur in the electrical propulsion system of a traction vehicle. Subsequent to a start step 100, step 102 allows turning off a first set of the plurality of electrical devices of the electrical propulsion system. For example, the first set which is turned off may comprise some of the traction motors of the propulsion system 10 (FIG. 1) while the remaining traction motors of the propulsion system continue to operate. In one example embodiment, the number of electrical devices in a set (which is simultaneously evaluated regarding the presence of an incipient ground fault) may comprise three traction motors, such as traction motors 40, 42 and 44. In another example embodiment, the number of electrical devices in the set may comprise two traction motors, such as traction motors 40 and 42. In yet another example embodiment, the number of electrical devices in the set may be one electrical device, such as traction motor 40.

Step 104 allows contemporaneously (e.g., simultaneously) connecting each electrical device in the set to a respective ground fault augmenting signal. More particularly, the ground fault augmenting signal being connected to any individual one of the electrical devices in the set has associated therewith a signal with a unique electrical characteristic. Assuming that traction motors 40, 42 and 44 are contemporaneously connected to receive a respective ground fault augmenting signal, then, by way of example, traction motor 40 may be connected to the positive rail 56 of DC bus 54 (FIG. 1) via inverter $52_1$. This may be achieved by turning on at least one power switching device, such as an Insulated Gate Bipolar Transistor (IGBT) in the upper leg of inverter $52_1$. Traction motor 42 may be connected to the negative rail 58 of the DC bus by way of inverter $52_2$. This may be achieved by turning on at least one IGBT in the lower leg of inverter $52_2$. Traction motor 44 may be connected to an ac (alternating current) ground fault augmenting signal by way of inverter $52_3$. This ac signal may be achieved by changing (at a suitable switching frequency) the respective connections of inverter $52_3$ to the positive and negative rails of the dc bus. For example, (ensuring not a simultaneous switching occurs) one may alternate turning on and off at least one IGBT in the upper leg and at least one IGBT in the lower leg of inverter $52_3$. Accordingly, in this example, each of the three traction motors is connected to a ground fault augmenting signal having a unique electrical characteristic. That is, in this example, the ground fault augmenting signal connected to traction motor 40 has a positive polarity. The ground fault augmenting signal connected to traction motor 42 has a negative polarity and the ground fault augmenting signal connected to traction motor 44 has an ac characteristic.

Step 106 allows monitoring a ground signal when each electrical device in the set is connected to its respective ground fault augmenting signal. For example, a monitor 70 (FIG. 1), such as a voltmeter and/or current sensor, may be connected across the positive and negative voltage rails of the dc bus when traction motors 40, 42 and 44 are each connected to its respective ground fault augmenting signal.

Step 108 allows determining whether the monitored ground signal, as may be monitored via monitor 70, indicates a presence of an incipient ground fault. Step 110 allows determining whether the incipient ground fault, if any, has a unique electrical characteristic associated with one of the respective ground fault augmenting signals connected to one of the electrical devices in the set. For example, assuming that in step 104 the ground fault augmenting signal connected to traction motor 40 has a positive polarity. Further assuming that in step 104 the ground fault augmenting signal connected to traction motor 42 has a negative polarity and the ground fault augmenting signal connected to traction motor 44 has an ac characteristic, then step 108 may allow to determine whether the monitored ground signal has a positive bias, a negative bias or an ac bias, which in a given case may for example exceed a predefined threshold, such as a positive threshold, a negative threshold or an ac threshold.

When the incipient ground fault exhibits one of the unique electrical characteristics associated with one of the respective ground fault augmenting signals connected to one of the electrical devices in the set, prior to a return step 114, step 112 allows assigning the incipient ground fault to that one electrical device. For example, again assuming that the ground fault augmenting signal connected to traction motor 40 has a positive polarity, that the ground fault augmenting signal connected to traction motor 42 has a negative polarity and that the ground fault augmenting signal connected to traction motor 44 has an ac characteristic, then an incipient ground fault with a positive bias would indicate that the such ground fault should be assigned to traction motor 40, whereas an incipient ground fault with a negative bias would indicate that the such ground fault should be assigned to traction motor 42. Similarly, an incipient ground fault with AC bias would indicate that the ground fault should be assigned to traction motor 44.

If the monitored ground signal lacks an incipient ground fault, one may proceed to turn on the first set of the plurality of electrical devices, such as traction motors 40, 42 and 44. One may then proceed to turn off a second set of the plurality of electrical devices, wherein the second set may comprise other electrical devices than in the first set, such as traction motors 46, 48 and 50. One would then proceed to perform the steps discussed in the context of FIG. 2 on the second set of electrical devices. In the example embodiment of a propulsion system that comprises six traction motors, and where the number of devices being tested in the first and second sets comprises six traction motors, (e.g., three different traction motors per set) then each of the six traction motors would have been evaluated regarding the possibility of an incipient ground fault after two iterations. It would be appreciated, however, that in the general case, further iterations of the method described in the context of FIG. 2 may be performed on any additional sets of traction motors, till each traction motor in the electrical propulsion system has been evaluated regarding the presence of an incipient ground fault.

As noted above, the size of the set of electrical devices being evaluated regarding the possibility of an incipient ground fault may consist of a triplet, or a pair of electrical devices, or even just one electrical device. In the case of a pair of electrical devices, the ground fault augmenting signal connected to one device may be chosen to have a positive polarity while the ground fault augmenting signal connected to the other device may be chosen to have a negative polarity. In the case of a set made up of a single electrical device, one may alternate the characteristic of the ground fault augmenting signal connected to successive devices. For example, the ground fault augmenting signal connected to the device in the first set may be chosen to have a positive polarity while the ground fault augmenting signal connected to the device in the second set may be chosen to have a negative polarity and such an alternating sequence may be repeated till each electrical device (e.g., traction motor in the propulsion system) has been evaluated regarding the possibility of an incipient ground fault.

Figure 3:
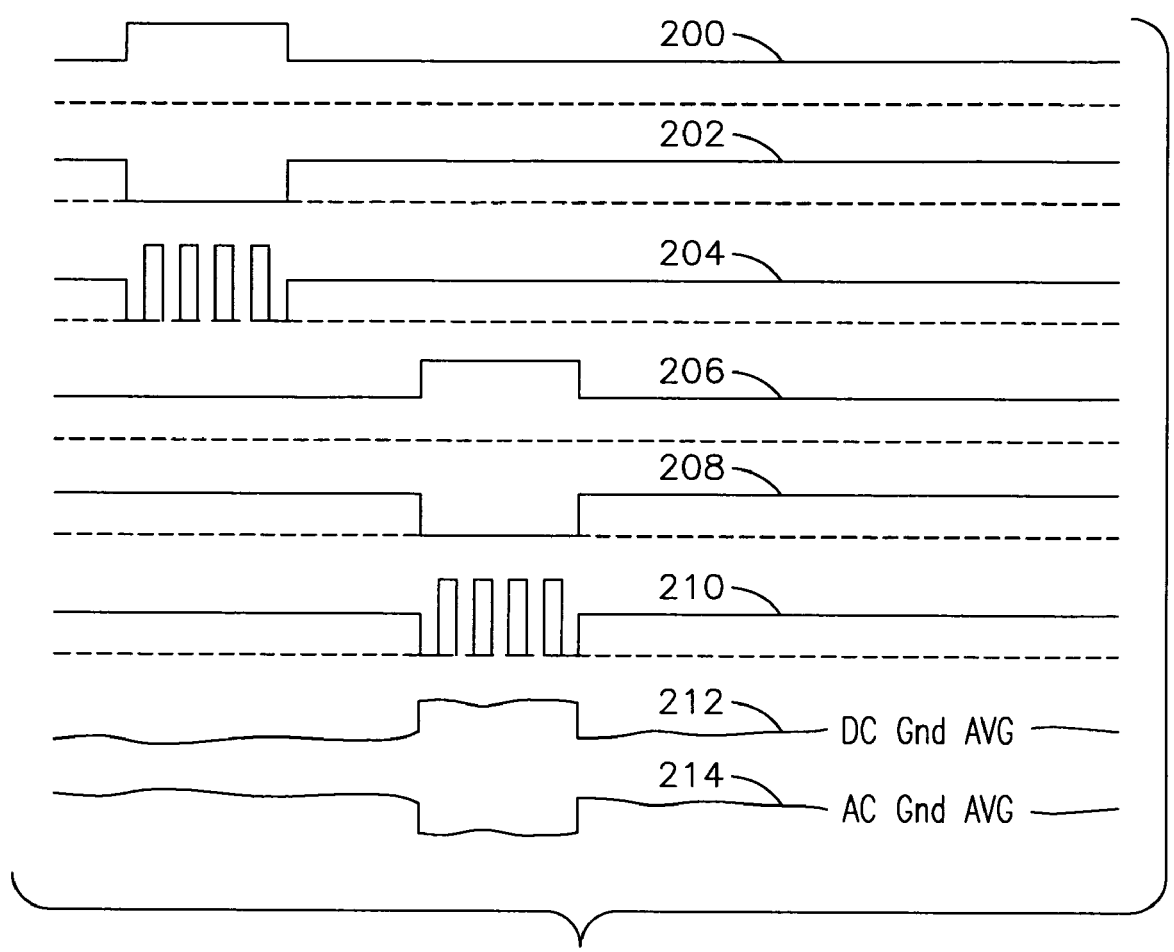
FIG. 3 is a signal timing diagram in connection with one example of detecting an incipient ground fault in accordance with aspects of the present invention.

FIG. 3 is a signal timing diagram in connection with one example of detecting an incipient ground fault in accordance with aspects of the present invention. More particularly, this example presumes a propulsion system that comprises six traction motors, each driven by a respective inverter. This example further presumes that sets of three traction motors are sequentially evaluated (each set being simultaneously connected to a respective ground fault augmenting signal through its respective inverter) to determine the presence of an incipient ground fault.

In this example, ground leakage signals 212 and 214 respectively represent a dc ground average and an ac ground average, each plotted as a function of time. The signals 200, 202 and 204 each represents a respective ground fault augmenting signal simultaneously connected to the first set of traction motors being evaluated for the presence of a ground fault (e.g., traction motors TM1, TM2 and TM3). The second set of traction motors (e.g., TM4, TM5 and TM6) continues normal operation while the first set of motors is being evaluated. In this example, signal 200 is a ground fault augmenting signal connected to traction motor TM1 and having a positive polarity. Signal 202 is a ground fault augmenting signal connected to traction motor TM2 and has a negative polarity. Signal 204 is a ground fault augmenting signal connected to traction motor TM3 and has an ac characteristic. It is observed that the dc ground average signal remains relatively low while the ac ground average signal remains moderately high while traction motors TM1, TM2 and TM3 are being evaluated. The mildly elevated ac ground signal suggests the presence of an incipient ground fault (whose location is yet to be determined). However, the dc ground average signal remaining relatively low while the traction motors TM1, TM2 and TM3 are being simultaneously evaluated, suggests that traction motors TM1 and TM2 are not candidates for the incipient ground fault. Similarly since the AC ground signal 214 did not substantially change, traction motor 3 is also not a candidate. Accordingly, traction motors TM1, TM2 and TM3 are returned to normal operation and one next proceeds to evaluate the second set of traction motors (i.e., TM4, TM5 and TM6).

In this example, signal 206 is a ground fault augmenting signal connected to traction motor TM4 and having a positive polarity. Signal 208 is a ground fault augmenting signal connected to traction motor TM5 and having a negative polarity. Signal 210 is a ground fault augmenting signal connected to traction motor TM6 and having an AC characteristic. At this point, it is observed that the dc ground average signal shows a positive dc bias (the same characteristic as the ground fault augmenting signal connected to traction motor TM4) while the ac ground average signal goes relatively low (as would be expected since traction motors TM4, TM5 and TM6 are not running while being evaluated). The positive dc bias strongly suggests that traction motor TM4 exhibits the incipient ground fault. This is consistent with the finding that a reduction in AC ground indicates that either traction motor TM4 or traction motor TM5 exhibits the incipient ground fault. Thus, in accordance with aspects of the present invention, one has being able to identify the specific location of the ground fault by virtue of the concept of applying a forcing function that does not increase the voltage stress to the traction motors and enables quick evaluation of multiple devices connected to the dc bus.

Aspects of the present invention can be embodied in the form of computer-implemented processes and apparatus for practicing those processes. The present invention can also be embodied in the form of computer program code including computer-readable instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. When implemented on a computer, the computer program code segments configure the computer to create specific logic circuits or processing modules.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

The invention claimed is:

1. A method for detecting an incipient ground fault that may occur in an electrical propulsion system of a traction vehicle, said electrical propulsion system comprising a plurality of electrical devices, said method comprising:
   a) turning off a first set of the plurality of electrical devices of the electrical propulsion system;
   b) contemporaneously connecting each electrical device in the set to a respective ground fault augmenting signal, wherein the ground fault augmenting signal connected to any individual one of the electrical devices in the set has associated therewith a signal with a unique electrical characteristic;
   c) monitoring a ground signal when each electrical device in the set is connected to its respective ground fault augmenting signal;
   d) determining whether the monitored ground signal indicates a presence of an incipient ground fault, and whether the incipient ground fault, if any, has the unique electrical characteristic associated with one of the respective ground fault augmenting signals connected to one of the electrical devices in the set; and
   e) when the incipient ground fault exhibits the unique electrical characteristics associated with one of the respective ground fault augmenting signals connected to one of the electrical devices in the set, assigning the incipient ground fault to said one electrical device.

2. The method of claim 1 further comprising:
   f) if the monitored ground signal lacks an incipient ground fault, returning to a normal operation a last set of electrical devices having been evaluated regarding a presence of an incipient ground fault;
   g) turning off an additional set of the plurality of electrical devices, wherein the additional set comprises other electrical devices not previously evaluated regarding a presence of an incipient ground fault; and h) performing steps b) through e) in any additional sets of electrical devices, till each electrical device which is part of the plurality of electrical devices in the electrical propulsion system has been evaluated regarding the presence of an incipient ground fault.

3. The method of claim 1 wherein the number of electrical devices in a set being evaluated regarding the presence of an incipient ground fault comprises three electrical devices.

4. The method of claim 3 wherein the unique electrical characteristic of the ground fault augmenting signal connected to any individual one of the three electrical devices in the set is selected from the group consisting of a positive polarity, a negative polarity and an alternating current (AC) variation.

5. The method of claim 1 wherein the number of electrical devices in a set being evaluated regarding the presence of an incipient ground fault comprises two electrical devices.

6. The method of claim 5 wherein the unique electrical characteristic of the ground fault augmenting signal connected to any individual one of the two electrical devices in the set is selected from the group consisting of a positive polarity, and a negative polarity.

7. The method of claim 1 wherein the number of electrical devices in a set being evaluated regarding the presence of an incipient ground fault comprises one electrical device.

8. The method of claim 7 wherein the unique electrical characteristic of the ground fault augmenting signal connected to the one electrical device in the set is selected from one of the following: a positive polarity, and a negative polarity.

9. The method of claim 1 wherein the plurality of electrical devices comprises a plurality of traction motors and the connecting of a respective ground fault augmenting signal to a respective traction motor is through an inverter coupled to the traction motor.

10. Apparatus for detecting an incipient ground fault that may occur in an electrical propulsion system of a traction vehicle, said electrical propulsion system comprising a plurality of electrical devices, said apparatus comprising:
   a) a controller configured to turn off a first set of the plurality of electrical devices of the electrical propulsion system;
   b) a controller configured to contemporaneously connect each electrical device in the set to a respective ground fault augmenting signal, wherein the ground fault augmenting signal connected to any individual one of the electrical devices in the set has associated therewith a signal with a unique electrical characteristic;
   c) a monitor configured to monitor a ground signal when each electrical device in the set is connected to its respective ground fault augmenting signal;
   d) a controller configured to determine whether the monitored ground signal indicates a presence of an incipient ground fault, and whether the incipient ground fault, if any, has the unique electrical characteristic associated with one of the respective ground fault augmenting signals connected to one of the electrical devices in the set; and
   e) when the incipient ground fault exhibits the unique electrical characteristics associated with one of the respective ground fault augmenting signals connected to one of the electrical devices in the set, a controller configured to assign the incipient ground fault to said one electrical device.

11. The apparatus of claim 10 wherein each of the controllers constitute a single controller.

12. The apparatus of claim 10 wherein the plurality of electrical devices comprises a plurality of traction motors and the respective ground fault augmenting signal connected to a respective traction motor is applied through an inverter coupled to the traction motor.

13. The apparatus of claim 10 wherein the traction vehicle is selected from the group consisting of a locomotive, a transit vehicle and off-highway vehicle.

14. An article of manufacture comprising a computer program product comprising a computer-usable medium having a computer-readable code therein for detecting an incipient ground fault that may occur in an electrical propulsion system of a traction vehicle, said electrical propulsion system comprising a plurality of electrical devices, said computer-readable code comprising:
   computer-readable code for turning off a first set of the plurality of electrical devices of the electrical propulsion system;
   computer-readable code for contemporaneously connecting each electrical device in the set to a respective ground fault augmenting signal, wherein the ground fault augmenting signal connected to any individual one of the electrical devices in the set has associated therewith a signal with a unique electrical characteristic;
   computer-readable code for monitoring a ground signal when each electrical device in the set is connected to its respective ground fault augmenting signal;
   computer-readable code for determining whether the monitored ground signal indicates a presence of an incipient ground fault, and whether the incipient ground fault, if any, has the unique electrical characteristic associated with one of the respective ground fault augmenting signals connected to one of the electrical devices in the set; and;
   when the incipient ground fault exhibits the unique electrical characteristics associated with one of the respective ground fault augmenting signals connected to one of the electrical devices in the set, computer-readable code for assigning the incipient ground fault to said one electrical device.

* * * * *